United States Patent
Dentoni Litta et al.

(10) Patent No.: US 11,515,399 B2
(45) Date of Patent: Nov. 29, 2022

(54) SELF-ALIGNED CONTACTS FOR WALLED NANOSHEET AND FORKSHEET FIELD EFFECT TRANSISTOR DEVICES

(71) Applicant: IMEC vzw, Leuven (BE)

(72) Inventors: Eugenio Dentoni Litta, Leuven (BE); Juergen Boemmels, Heverlee (BE); Julien Ryckaert, Schaerbeek (BE); Naoto Horiguchi, Leuven (BE); Pieter Weckx, Bunsbeek (BE)

(73) Assignee: IMEC vzw, Leuven (BE)

( * ) Notice: Subject to any disclaimer, the term of this patent is extended or adjusted under 35 U.S.C. 154(b) by 67 days.

(21) Appl. No.: 17/112,844

(22) Filed: Dec. 4, 2020

(65) Prior Publication Data

US 2021/0193821 A1   Jun. 24, 2021

(30) Foreign Application Priority Data

Dec. 20, 2019  (EP) .................................... 19218708

(51) Int. Cl.
*H01L 29/66*   (2006.01)
*H01L 27/092*   (2006.01)
(Continued)

(52) U.S. Cl.
CPC .. *H01L 29/66515* (2013.01); *H01L 21/02603* (2013.01); *H01L 21/823807* (2013.01);
(Continued)

(58) Field of Classification Search
CPC ....... H01L 21/823871; H01L 21/02603; H01L 21/76224; H01L 21/823807;
(Continued)

(56) References Cited

U.S. PATENT DOCUMENTS

| 9,929,048 B1 | 3/2018 | Xie et al. |
| 2018/0151494 A1 | 5/2018 | Ohtou et al. |

(Continued)

FOREIGN PATENT DOCUMENTS

| EP | 3 324 436 A1 | 5/2018 |
| EP | 3 454 366 A1 | 3/2019 |
| WO | WO 2019/151024 A1 | 8/2019 |

OTHER PUBLICATIONS

Extended European Search Report dated Jun. 8, 2020 in counterpart European Application No. 19218708.6 in 11 pages.

*Primary Examiner* — Tong-Ho Kim
(74) *Attorney, Agent, or Firm* — Knobbe, Martens, Olson & Bear, LLP (57) ABSTRACT

In one aspect, a method of forming a semiconductor device can comprise forming a first transistor structure and a second transistor structure separated by a first trench which comprises a first dielectric wall protruding above a top surface of the transistor structures. The first and the second transistor structures each can comprise a plurality of stacked nanosheets forming a channel structure, and a source portion and a drain portion horizontally separated by the channel structure. The method further can comprise depositing a contact material over the transistor structures and the first dielectric wall, thereby filling the first trench and contacting a first source/drain portion of the first transistor structure and a first source/drain portion of the second transistor structure. Further, the method can comprise etching back the contact material layer below a top surface of the first dielectric wall, thereby forming a first contact contacting the first source/drain portion of the first transistor structure, and a second contact contacting the first source/drain portion of the second transistor structure.

18 Claims, 5 Drawing Sheets

(51) Int. Cl.

| | |
|---|---|
| *H01L 29/06* | (2006.01) |
| *H01L 29/423* | (2006.01) |
| *H01L 29/417* | (2006.01) |
| *H01L 29/786* | (2006.01) |
| *H01L 23/528* | (2006.01) |
| *H01L 21/02* | (2006.01) |
| *H01L 21/8238* | (2006.01) |

(52) U.S. Cl.
CPC .. *H01L 21/823871* (2013.01); *H01L 23/5286* (2013.01); *H01L 27/092* (2013.01); *H01L 29/0673* (2013.01); *H01L 29/41733* (2013.01); *H01L 29/42392* (2013.01); *H01L 29/66742* (2013.01); *H01L 29/78696* (2013.01)

(58) Field of Classification Search
CPC ..... H01L 21/823814; H01L 21/823864; H01L 21/823878; H01L 23/5286; H01L 27/092; H01L 29/0673; H01L 29/41733; H01L 29/42392; H01L 29/66515; H01L 29/66545; H01L 29/66553; H01L 29/66742; H01L 29/78618; H01L 29/78696; H01L 29/66439; H01L 29/66772; H01L 29/775; H01L 29/78654; H01L 29/0653; H01L 21/743; H01L 21/76895
USPC ........................................................ 438/154
See application file for complete search history.

(56) References Cited

U.S. PATENT DOCUMENTS

| | | |
|---|---|---|
| 2018/0374791 A1 | 12/2018 | Smith et al. |
| 2020/0006155 A1 | 1/2020 | Chiang et al. |
| 2020/0119004 A1* | 4/2020 | Ching ............... H01L 29/42392 |
| 2020/0135578 A1 | 4/2020 | Ching et al. |
| 2021/0057536 A1* | 2/2021 | Lee ................... H01L 29/78696 |
| 2021/0119031 A1* | 4/2021 | Song ..................... H01L 29/785 |
| 2021/0183711 A1 | 6/2021 | Dentoni Litta et al. |

* cited by examiner

SELF-ALIGNED CONTACTS FOR WALLED NANOSHEET AND FORKSHEET FIELD EFFECT TRANSISTOR DEVICES

CROSS-REFERENCE TO RELATED APPLICATIONS

This application claims foreign priority to European Patent Application No. EP 19218708.6, filed Dec. 20, 2019, the content of which is incorporated by reference herein in its entirety.

BACKGROUND

Technical Field

The disclosed technology generally relates to the field of forming semiconductor devices such as field-effect transistor (FET) devices.

Description of the Related Technology

In striving to provide more power- and area-efficient circuit designs, new transistor devices are being developed.

Horizontal channel field effect transistor (FET) devices include the fin field-effect transistor (finFET), which can have a gate straddling a channel portion of a fin-shaped semiconductor structure, and the horizontal nanowire- or nanosheet-FET (horizontal NWFET or NSFET), which can have a gate at least partly enclosing a channel portion of a horizontally oriented nanowire- or nanosheet-shaped semiconductor structure.

Efficient process flows dedicated to fabrication of horizontal channel FET devices have been developed. However, the objective of developing more area efficient FET devices using more convenient fabrication methods still remains.

SUMMARY OF CERTAIN INVENTIVE ASPECTS

An objective of the disclosed technology is therefore to provide an improved method of forming a semiconductor structure including FET devices.

According to an aspect of the disclosed technology, there is provided a method of forming a semiconductor device comprising a first field-effect transistor (FET) device and a second FET device. The method can comprise: forming, on a semiconductor substrate, a first transistor structure and a second transistor structure separated by a first trench. The first trench can comprise a first dielectric wall protruding above a top surface of the transistor structures. Each of the first and the second transistor structures can comprise a plurality of stacked nanosheets forming a channel structure, and a source portion and a drain portion horizontally separated by the channel structure. The method can also comprise depositing a contact material over the transistor structures and the first dielectric wall, thereby filling the first trench and contacting a first source/drain portion of the first transistor structure and a first source/drain portion of the second transistor structure; and etching back the contact material layer below a top surface of the first dielectric wall, thereby forming a first contact contacting the first source/drain portion of the first transistor structure, and a second contact contacting the first source/drain portion of the second transistor structure.

Throughout this disclosure, transistor structure can refer to a semiconductor structure from which a transistor (or FET device) may be formed. Each of the transistor structures and thus, in the end, the final FET devices can comprise a plurality of horizontally stacked nanosheets.

Each of the transistor structures may form, or be arranged to form, a FET device. A channel FET device can hereby refer to a device comprising a semiconductor structure comprising a first and a second source/drain portion and a channel portion located intermediate and extending between the first and second source/drain portions, and further comprising a gate structure extending along the channel portion. In a horizontal channel FET device, the first and second source/drain portions and the channel portion may intersect a common horizontal plane. The channel portion can be adapted to (in use of the device) conduct a flow of charge carriers between the source/drain.

As used herein, vertical may refer to a direction or orientation (e.g., of a surface, a dimension or other feature) parallel to a normal to the substrate (e.g., a main plane of extension or main/upper surface thereof). Horizontal meanwhile may refer to a direction or orientation parallel to the substrate (e.g., a main plane of extension or main surface thereof), or equivalently transverse to the vertical direction. Meanwhile, terms such as "above", "upper", "top", "below", "lower", or "bottom" can refer to relative positions as viewed along the vertical direction and do not imply an absolute orientation of the substrate or device.

Through the etch-back of the contact material layer below the top surface of the first dielectric wall, the contact material layer can be divided into a first contact and a second contact separated by the first dielectric wall. The first contact can contact the first source/drain region of the first transistor structure. The second contact can contact the first source/drain portion of the second transistor structure. In some implementations, as the contact material is formed across the source/drain portions of the first transistor structure and the second transistor structure and in the first trench, the first contact may wrap at least partly around at least two surfaces of the first source/drain portion of the first transistor structure, and the second contact may wrap at least partly around at least two surfaces of the first source/drain portion of the second transistor structure. In some instances, the method may comprise depositing the contact material to form wrap-around contacts. A wrap-around contact may improve the control of the contact on the source/drain portion.

As the contact material is etched back below the top surface of the first dielectric wall, the size and position of the contacts may be defined by the first dielectric wall in some implementations. The contacts may in some instances be formed self-aligned with the first trench and the first source/drain portions.

In some instances, the distance between adjacent contacts can be limited by the width of the first dielectric wall. For example, the separation of the contacts may be controlled by the width of the first dielectric wall.

Using the above-defined methods, the contacts may be formed with higher accuracy. The contacts may also be formed with a smaller pitch (distance) between them. The above-defined methods may thus reduce the size of the resulting FET devices.

According to some embodiments, the first FET device and the second FET device may be of the same dopant type.

For example, both the first FET device and the second FET device may be p-type FET devices. Alternatively, both the first FET device and the second FET device may be n-type FET devices.

It will be appreciated that the first FET device and the second FET device may also be of the opposite dopant type.

According to some embodiments, depositing a contact material may comprise depositing the contact material in a continuous line extending in a direction from the first source direction from the first source/drain portion of the first transistor structure towards the first source/drain portion of the second transistor structure, across the transistor structures, the first trench and the first dielectric wall.

The contact material may in some instances, be deposited such that a continuous line is formed in the horizontal plane across from the first source/drain portion of the first transistor structure towards a first source/drain portion of the second transistor structure.

Applying the contact material in a continuous line across (a source/drain region of) both transistor structures and then etching back the contact material below a top surface of the first dielectric wall to divide the contact material line into individual contacts may facilitate the formation of the contacts. Forming a continuous line of contact material and dividing it into individual contacts may for example be more convenient than applying the material as discrete contacts. In some such methods, smaller contacts may be formed with a higher accuracy.

According to some embodiments, forming the dielectric wall may comprise forming spacers in the first trench at sidewalls of the first transistor structure and the second transistor structure. The spacers may protrude above a top surface of the transistor structures. Forming the first dielectric wall may further comprise forming the first dielectric wall in the first trench between the spacers and removing the spacers.

For example, the spacer material may be formed conformally in the trench, and anisotropically (top-down) etched to form the spacers. The dielectric wall may be formed by filling a gap between the spacers with a dielectric material. The spacers may for example be removed using a selective etch.

Forming spacers on the sidewalls of the first and second transistor structure and forming the first dielectric wall between the spacers may provide that the dielectric wall can be formed self-aligned between the transistor structures.

According to some embodiments, forming the first transistor structure and the second transistor structure may comprise, e.g., prior to the formation of the first dielectric wall, etching the substrate through the trench, thereby forming a substrate trench, and forming a buried power rail (BPR) in the substrate trench.

The method may further comprise, e.g., prior to depositing the contact material layer, applying a mask layer including an opening which exposes at least a portion of the first source/drain portion of the first transistor structure. The mask layer may further expose a portion of the trench between the first transistor structure and the first dielectric wall, and a portion of the first dielectric wall. The mask layer may cover at least another portion of the first dielectric wall. The method may further comprise exposing the BPR in the bottom of the trench by etching through the exposed portion of the first trench and removing the mask layer.

The BPR may be embedded in, or covered with, a dielectric or isolating material. For example, in the substrate trench, the BPR may be covered, at least on a sidewall facing the first transistor structure, by a first dielectric material. On a top surface of the BPR, a dielectric cap may be formed of a second dielectric material. The BPR may be exposed in the bottom of the second trench by selectively etching the second dielectric material of the dielectric cap, e.g., while not etching the first dielectric material in some implementations. The first dielectric material may in some instances decrease the risk of a short connection between the BPR and the portion of the substrate (or subfin) on which the first transistor structure is formed.

In some embodiments in which a BPR is formed in the substrate and exposed prior to the deposition of the contact material, the contact may be a contact between the BPR and the first source/drain portion of the first transistor structure.

According to some embodiments, the method may further comprise forming a third transistor structure on the semiconductor substrate. The third transistor structure may be separated from the first transistor structure by a second trench. The second trench may have a width smaller than the width of the first trench.

The third transistor structure may comprise a plurality of stacked nanosheets forming a channel structure. The third transistor structure may further comprise a source portion and a drain portion. The source portion and the drain portion may be horizontally separated by the channel structure.

The method may further comprise forming a second dielectric wall filling the second trench. The second dielectric wall may protrude above a top surface of the transistor structures. The method may further comprise etching back the contact material layer below a top surface of the second dielectric wall.

The first and the third transistor structure may together form a forksheet transistor structure. In some such structures, two neighboring FET devices can be separated by a dielectric wall. A dielectric wall between two FET devices may allow for electrical separation/isolation between the FET devices with a shorter distance/pitch between the FET devices. In some implementations, the resulting FET devices may be more closely arranged on the substrate.

According to some embodiments, the method may further comprise forming a third transistor structure with nanosheets on the semiconductor substrate. The third transistor structure may be separated from the first transistor structure by a second trench. The second trench may comprise a second dielectric wall which may protrude above a top surface of the transistor structures.

The third transistor structure with nanosheets may comprise a plurality of stacked nanosheets which may form a channel structure. The third transistor structure with nanosheets may further comprise a source portion and a drain portion. The source portion and the drain portion may be horizontally separated by the channel structure.

The method may further comprise etching back the contact material layer below a top surface of the second dielectric wall.

The third transistor structure may form a third FET device. In accordance with some embodiments, the resulting FET devices can be nanosheet FET devices. Some such FET devices may comprise a wrap-around gate, which wraps around the channel structure of the FET device. A wrap-around gate may provide improved control of the horizontally oriented flow of charge carriers through the channel structure between the source and drain portions of the FET device.

According to some embodiments, a third FET device, which may be formed from the third transistor structure, may be a FET device of a different dopant type than the first FET device.

According to some embodiments, forming the first semiconductor structure and the second semiconductors structure on the substrate may comprise, e.g., prior to forming the first dielectric wall, forming a substrate trench by etching the substrate through the first trench. The method may further comprise filling the substrate trench with an isolating material.

Forming a trench in the substrate between neighboring transistor structures, and filling the trench with an isolating material, may improve electrical separation/isolation of the transistor structures (and final transistor devices) through the substrate.

It will be appreciated that, according to some embodiments, the method may comprise forming a BPR in the substrate trench prior to filling the substrate trench with an isolating material. Alternatively, the method may comprise forming a BPR in the substrate trench after filling the substrate trench with an isolating material.

According to some embodiments, the method may further comprise, prior to forming the contact material layer, forming an interlayer dielectric over the transistor structures and the first dielectric wall, and filling the first trench. The method may further comprise removing the interlayer dielectric in a region extending between the first source/drain portion of the first transistor structure and the first source/drain portion of the second transistor structure across the first dielectric wall and the first trench.

It will be appreciated that the interlayer dielectric may be kept at other regions of the transistor structures and the first trench. Providing an interlayer dielectric across the transistor structures and the (first) trench, and then removing portions of the interlayer dielectric in a specific region may provide an opening in the interlayer dielectric layer. The opening may be formed to expose portions of the transistor structures, substrate and/or BPR etc. which the contact material layer is intended to be in contact with. In some implementations, the interlayer dielectric may provide increased precision in the application of the contact material.

According to some embodiments, each of the transistor structures may comprise a sacrificial gate structure extending across the channel structures. The method may further comprise, e.g., prior to removing the interlayer dielectric in the abovementioned region, replacing the sacrificial gate structure with a final gate structure. As used herein, reference to "each" of a particular element (e.g., "each of the transistor structures") may refer to two or more of the elements, and may or may not refer to every one of the elements in the device. For example, "each of the transistor structures" may refer to individual ones of a plurality of transistor structures and not necessarily every single transistor structure in the device.

It is noted that other embodiments using all possible combinations of features recited in the above described embodiments may be envisaged. Thus, the disclosed technology also relates to all possible combinations of features mentioned herein. Any embodiment described herein may be combinable with other embodiments also described herein, and the disclosed technology relates to all combinations of features.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

A method of forming a semiconductor device will now be described with reference to the figures. Reference will throughout be made to a first field-effect transistor (FET) device region 10, a second FET device region 20 and a third FET device region 30, of a semiconductor substrate 126. Each of the FET device regions 10, 20, 30 can be a region for supporting a FET device. In each FET device region 10, 20, 30 a transistor structure can be formed.

As may be appreciated, the substrate 126 and the transistor structure regions 10, 20, 30 may typically present a much greater lateral/horizontal extension than shown, beyond the illustrated section. It may further be noted that the relative dimensions of the shown structures, for instance the relative thickness of layers, are merely schematic and may, for the purpose of illustrational clarity, differ from a physical device structure.

Figure 1:
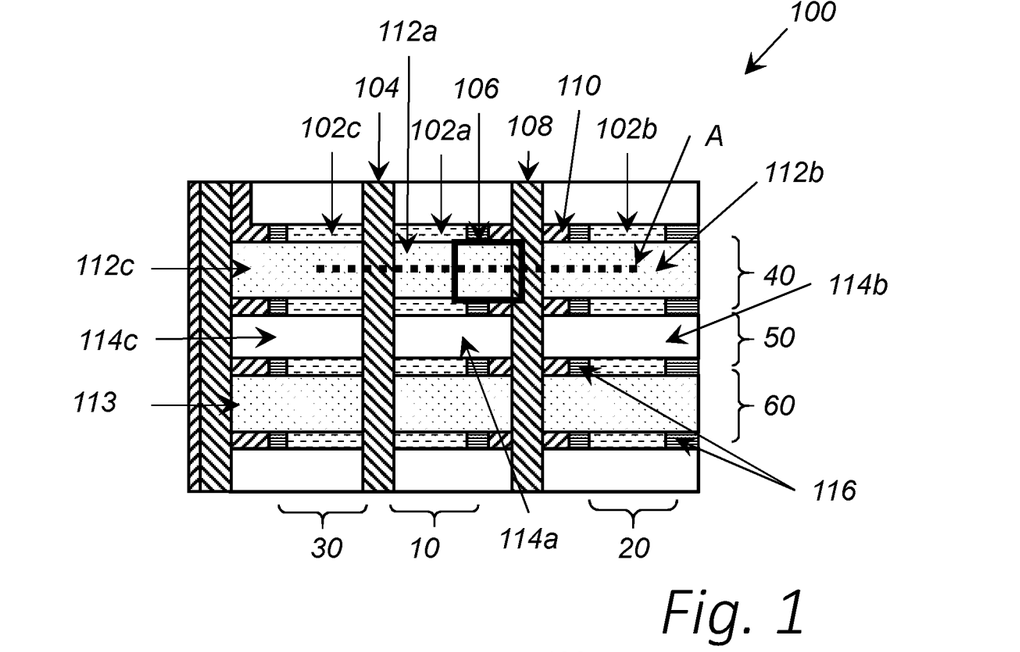
FIG. 1 is a plan view of a semiconductor structure, in accordance with some embodiments.

FIG. 1 is a plan (top-down) view of a semiconductor structure 100 comprising three FET device regions 10, 20, 30, during formation of the FET devices. Specifically, FIG. 1 shows the semiconductor structure 100 at a stage of formation of the FET devices after etch-back of the contact material layer leading to formation of individual contacts 112a-c, 113.

The semiconductor structure 100 can comprise a first FET device region 10 in which a first transistor structure is formed, a second FET device region 20 in which a second transistor structure is formed and a third FET device region 30 in which a third transistor structure is formed. Each of the FET device regions 10, 20, 30 can comprise a first source/drain region 40, a channel region 50 and a second source/drain region 60.

Each of the transistor structures can comprise a plurality of stacked nanosheets 102a-c of which only the topmost nanosheet is visible in the illustration. In each transistor structure, the plurality of nanosheets 102a-c can form a channel structure separating the first source/drain portion (formed in the first source/drain region 40) of the transistor structure from a second source/drain portion (formed in the second source/drain region 60) of the transistor structure.

The second transistor structure can be separated from the first transistor structure by a first trench. A first dielectric wall 108 can be formed in the trench at a distance from a sidewall of the first transistor structure, and at a distance from a sidewall of the second transistor structure. In the bottom of the first trench, a buried power rail (BPR) 110 can be formed in the substrate. An isolating material 116 can be formed at sidewalls of the BPR 110, within the substrate.

The third transistor structure can be separated from the first transistor structure by a second trench, which has a smaller width than the first trench. In the second trench, a second dielectric wall 104 can be formed. Specifically, the second dielectric wall 104 can be formed filling the second trench.

The first FET device region 10 and the third FET device region 30 may together form a pair or a cell. The second FET device region 20 may form a pair or a cell with a further FET device region (not depicted) on the opposite side of the second FET device region 20. Between each pair/cell, a BPR 110 may be formed in the substrate. A BPR is often not formed within a pair/cell.

A first gate structure 114a can extend in the channel region 50, across the channel structure formed by the stack of nanosheets 102a of the first transistor structure. A second gate structure 114b can extend in the channel region 50 across the channel structure formed by the stack of nanosheets 102b of the second transistor structure. And a third gate structure 114c can extend in the channel region 50, across the channel structure formed by the stack of nanosheets 102c of the first transistor structure. A first set of contacts 112a-c can be formed in the first source/drain region 40. The first contact 112a can extend between the second dielectric wall 104 and the first dielectric wall 108, across the source/drain portion of the first transistor structure, and into the trench. The second contact 112b can extend from the first dielectric wall 108, across the trench and the first source/drain portion of the second transistor structure. The third contact 112c can extend from the second dielectric wall 104, across the source/drain portion of the third transistor structure.

A second set of contacts 113 can extend in a similar manner in the second source/drain region 60, across the second source/drain portions of the transistor structures.

A black rectangle can indicate a via 106 to the BPR 110. This can represent where a via 106 is formed connecting the contact material 112a to the BPR 110.

FIGS. 2a-7b show in perspective a section of the substrate 126 through a first source/drain portion of the FET device regions, along the dashed line A of FIG. 1. The illustrated planes of section extending through the structure 100 are common to all the figures, unless indicated otherwise.

Figure 2A:
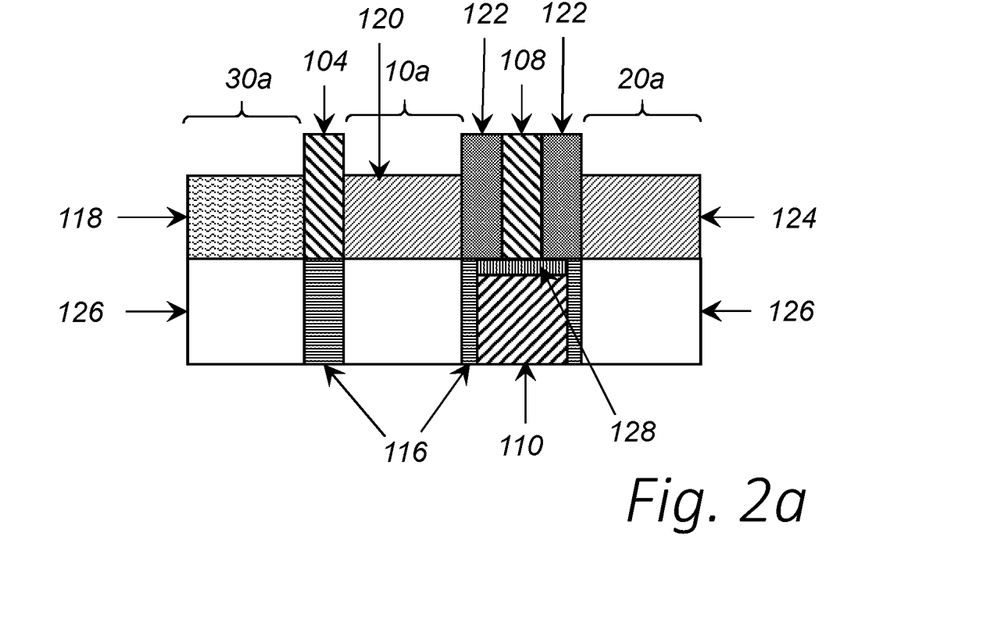
FIGS. 2a, 2b, 3, 4, 5, 6, 7a, and 7b illustrate various intermediate structures of a method of forming a semiconductor device, in accordance with some embodiments.

FIG. 2a shows a substrate 126, on which a first transistor structure, a second transistor structure and a third transistor structure are formed. The substrate 126 can be a semiconductor substrate, e.g., a substrate comprising at least one semiconductor layer. The substrate 126 may be a single-layered semiconductor substrate, for instance formed by a bulk substrate. The substrate 126 may however also be a multi-layered substrate, for instance formed by an epitaxially grown semiconductor layer on a bulk substrate, or a semiconductor-on-insulator (SOI) substrate.

As is further shown in FIG. 2a, a first transistor structure can be formed in a first FET device region 10a. A first source/drain portion 120 of the first transistor structure is visible in the figures.

A second transistor structure can be formed in a second FET device region 20a. A first source/drain portion 124 of the second transistor structure is visible in FIG. 2a.

The first and second transistor structures (represented by their respective first source/drain portions 120, 124) can be separated by a trench. In the trench, spacers 122 can be formed at a sidewall of the first source/drain portion 120 of the first transistor structure and at a sidewall of the first source/drain portion 124 of the second transistor structure. It will be appreciated that the spacers 122 may extend in a direction along the trench and the first and second transistor structures.

For example, the material of the spacers 122 may be conformally deposited over the first transistor structure and the second transistor structure, before being anisotropically (top-down) etched to form the spacers 122. The spacer material may for example be silicon nitride (SiN), silicon carbon oxide (SiCO), or silicon carbonitride (SiCN). In some implementations, the spacer material can be conformally deposited by for example atomic layer deposition (ALD) and chemical vapor deposition (CVD).

A third transistor structure can be formed in a third FET device region 30a. A first source/drain portion 118 of the third transistor structure is visible in FIG. 2a. The third transistor structure can be separated from the first transistor structure by a second trench which has a smaller width than the first trench which separates the first transistor structure and the second transistor structure. In the second trench between the first and third transistor structures, a dielectric wall 104 can be formed protruding above a top surface of the transistor structures. The dielectric wall 104 may for example be formed from SiN, SiCO, or SiCN.

The source/drain portions 118, 120, 124, may form source/drain terminals of the final FET devices. In an example, the first source/drain region 118 of the third transistor structure can be formed by an n-doped selective epitaxial silicon or silicon carbon process, using for instance phosphorus (P), arsenic (As), or antimony (Sb) as dopants, whereas the first source/drain regions 120, 124 of the first and the second transistor structures can be formed by a p-doped selective epitaxial silicon or silicon germanium process. In the latter example, boron (B) or gallium (Ga) may be used as dopants.

The dielectric wall 104 may facilitate separation between the negative metal oxide semiconductor (NMOS) and the positive metal oxide semiconductor (PMOS) devices formed in this process.

Prior to the formation of the spacers 122 and the dielectric walls 104, 108, the substrate 126 may be etched through the trenches separating the respective transistor structures. Substrate trenches may thus be formed in the substrate 126. As is shown in FIG. 2a, a buried power rail (BPR) 110 may be formed in the substrate trench between the first transistor structure and the second transistor structure. As further shown in FIG. 2a, the trenches formed in the underlying thickness portion of the substrate 126 (the substrate trenches) may be filled with an isolating material 116, thereby separating the FET device regions 10a, 20a, 30a of the substrate 126, on which the FET devices are formed, using shallow trench isolation (STI).

A dielectric/isolating cap 128 may be formed over the BPR 110. The dielectric cap may be formed from a different dielectric/isolating material than the isolating material 116. In some instances, the dielectric/isolating cap may be formed of a material which may be selectively etched relative to the isolating (STI) material 116.

Figure 2B:
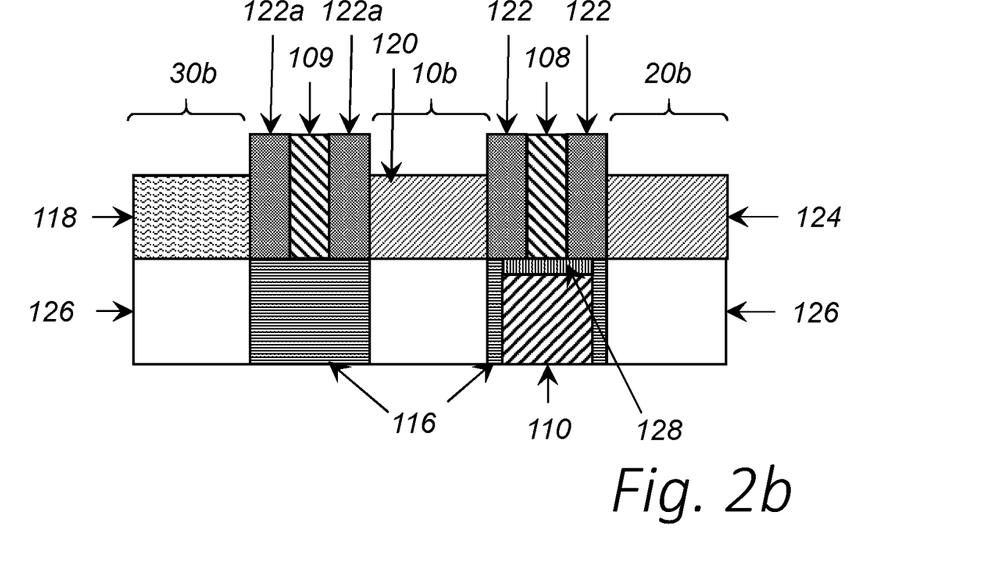

The semiconductor structure shown in FIG. 2a may be a starting position of forming a forksheet FET device, in accordance with some embodiments. FIG. 2b shows a starting position of forming a nanosheet FET device, in accordance with other embodiments.

FIG. 2b also shows a substrate 126, on which a first transistor structure, a second transistor structure and a third transistor structure are formed. As is shown in FIG. 2b, the first transistor structure formed in the first FET device region 10b, the second transistor structure formed in the second FET device region 20b, and the trench and structures between them may be similar or equivalent to the corresponding features in FIG. 2a.

In FIG. 2b, the third transistor structure formed in the third FET device region 30b, can be separated from the first transistor structure by a second trench. In the second trench, second spacers 122a can be formed at a sidewall of the first source/drain portion 118 of the third transistor structure and at a sidewall of the first source/drain portion 120 of the first transistor structure. It will be appreciated that the second spacers 122a may also extend in a direction along the trench and the first and third transistor structures. A second dielectric wall 109 can be formed in the second trench, between the second spacers. The second spacers 122a and the second dielectric wall 109 may be similar or equivalent to, and be formed in a similar manner as, the spacers 122 and the first dielectric wall 108 described with reference to FIG. 2b.

Further, prior to the formation of the second spacers 122a and the second dielectric wall 109, a second substrate trench can be formed in the substrate between the first and the third transistor structures, the second substrate trench can be filled with an isolating material 116.

In the following, the method will be described with reference to figures showing the structure of FIG. 2a. However, the same or similar method may be applied to structures like the one described with reference to FIG. 2b.

Figure 3:
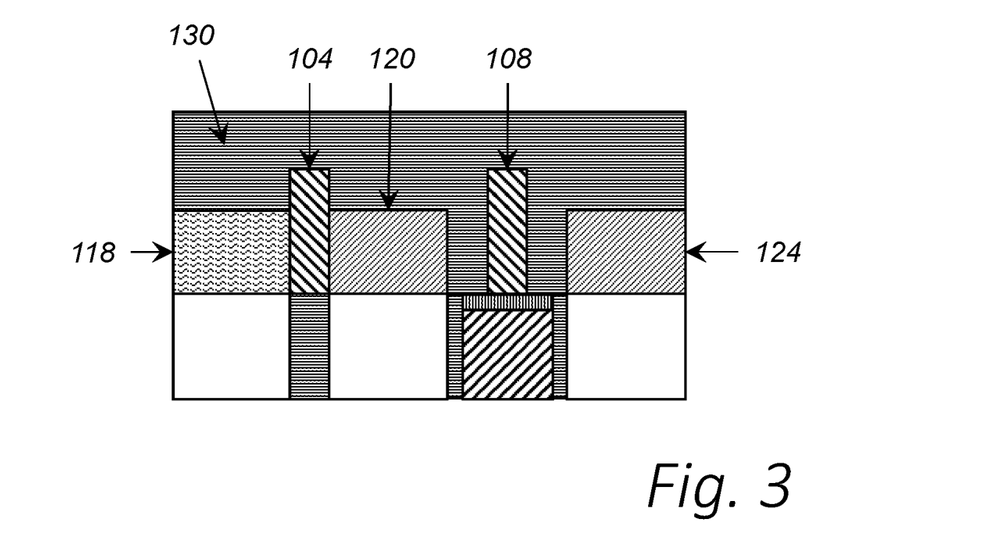

In FIG. 3, an interlayer dielectric 130 can be formed over the semiconductor structure and filling the trench. The interlayer dielectric 130 may be formed by the same material as the isolating material 116 forming the STI in some instances. It will be appreciated that the application of the interlayer dielectric 130 may be optional.

At this point during the formation of the semiconductor structure, sacrificial gate structures which may have been formed in the channel regions 50 of the different transistor structures may be replaced with final gate structures 114a-c. It will however be appreciated that a replacement gate procedure may take place during other steps of the formation of the semiconductor structure.

Figure 4:
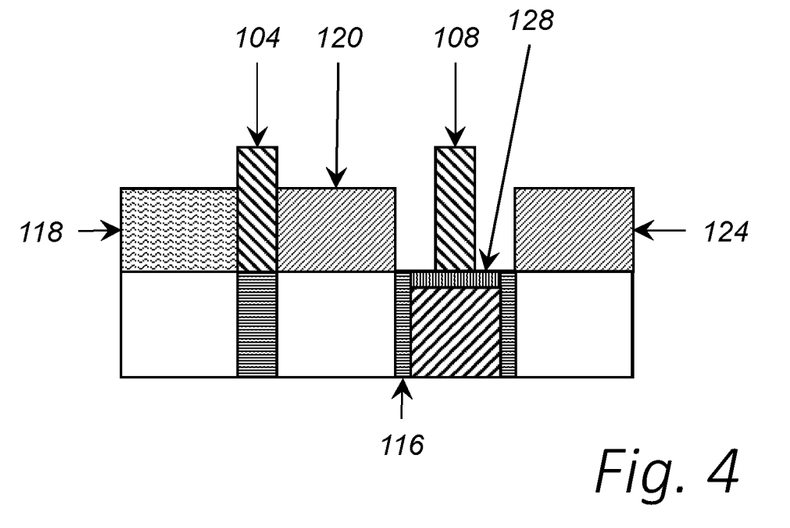

In FIG. 4, the interlayer dielectric can be removed from a region of the semiconductor structure which includes the present cross-section. In some instances, at least portions of the first source/drain portion 118, 120, 124, the dielectric walls 104, 108 and portions of the dielectric cap 128 and the isolating material in the trench can be exposed.

Figure 5:
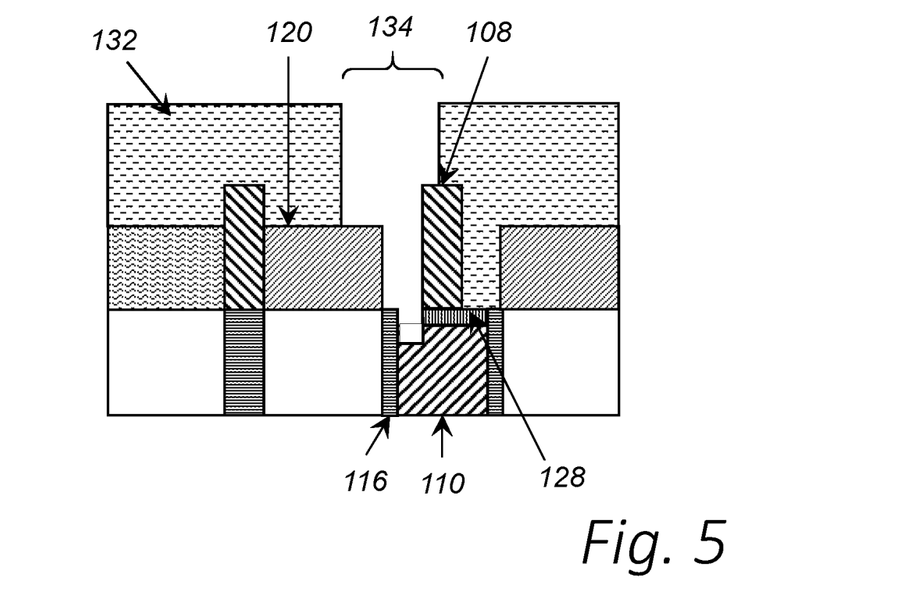

In FIG. 5, a mask layer 132 can be applied to (e.g., formed over) the semiconductor structure. The mask layer 132 can comprise an opening 134 which exposes (at least) a portion of the first source/drain portion 120 of the first transistor structure. The opening 134 further can expose a portion of the first dielectric wall 108, and a portion of the trench between the first source/drain portion 120 of the first transistor structure and the first dielectric wall 108. The mask layer 132 can cover another portion of the first dielectric wall 108.

As is further shown in FIG. 5, in the bottom of the trench, the dielectric cap 128 can be selectively etched using the exposed portion of the trench as an etch mask. A portion of the BPR 110 can be exposed in the bottom of the trench. The etch can also remove a small portion of the BPR 110, which is optional. In some instances, the isolating material 116 may not be etched and may reduce the risk of a short connection between the BPR 110 and the subfin/substrate of the first transistor structure.

Figure 6:
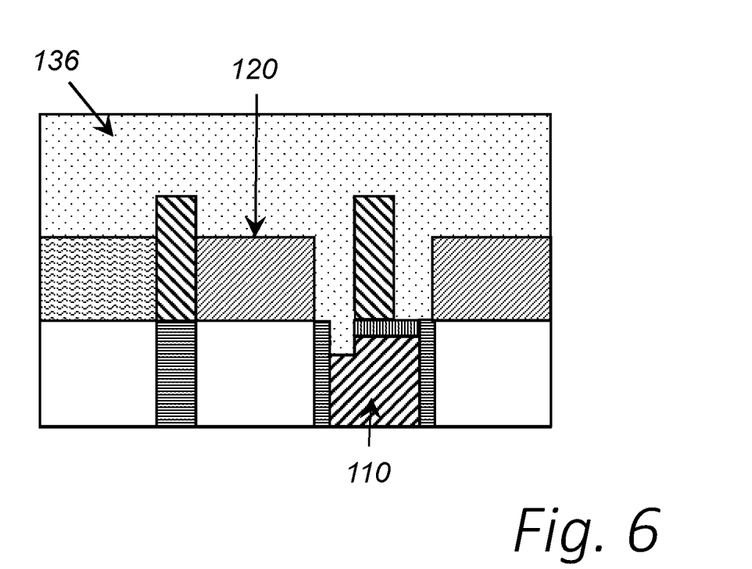

In FIG. 6, a contact material layer 136 can be deposited across the first source/drain region 40 of the transistor structures. The contact material layer 136 may be deposited using for example atomic layer deposition (ALD), chemical vapor deposition (CVD), physical vapor deposition (PVD) or plating. Possible metals in contact metallization include for example titanium (Ti), nickel (Ni), nickel-platinum (NiPt), tungsten (W), cobalt (Co), ruthenium (Ru), molybdenum (Mo), titanium nitride (TiN), and tungsten nitride (WN).

The contact material layer 136 may have been deposited in a continuous line in the first source/drain region 40 of the transistor structures.

In some implementations, the contact material layer 136 can be in contact with the BPR 110 and the first source/drain portion 120 of the first transistor structure.

Figure 7A:
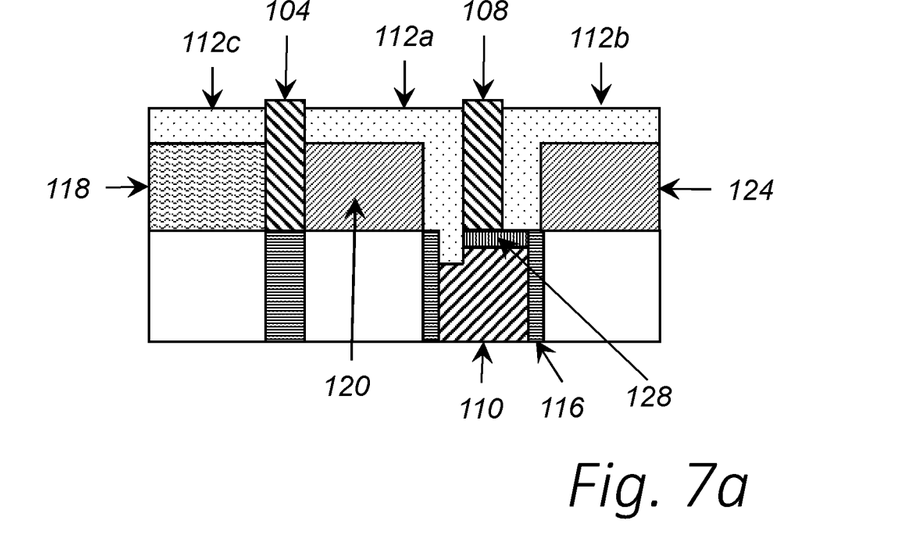

In FIG. 7a, the contact material layer 136 can be etched back below a top surface of the first dielectric wall 108 and below a top surface of the second dielectric wall 104. In various implementations, the contact material layer can be divided into three contacts 112a-c. The first contact 112a can contact the BPR 110 and wraps at least partly around the top and a sidewall of the first source/drain portion 120 of the first transistor structure.

The second contact 112b can be separated from the first contact 112a by the first dielectric wall 108. The second contact 112b can wrap at least partly around the top and a sidewall of the first source/drain portion 124 of the second transistor structure. The isolating material 116 and the dielectric/isolating cap 128 can isolate the second contact 112b from the BPR 110 in some instances.

Figure 7B:
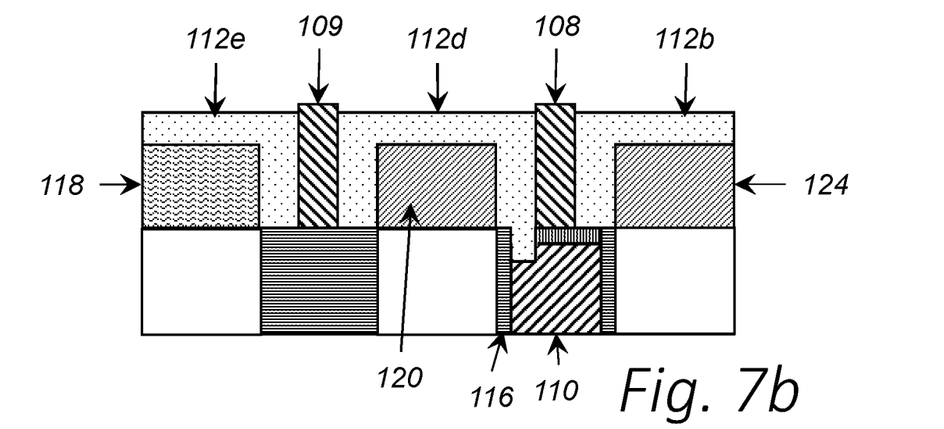

The third contact 112c can be separated from the first contact 112a by the second dielectric wall 104. The third contact can be in connection with the first source/drain portion 118 of the third transistor structure FIG. 7b shows a semiconductor structure allowing for formation of nanosheet FET devices similar to that of FIG. 2b. FIG. 7b shows the semiconductor structure after etch-back of the contact material layer. In some instances, FIG. 7b shows a situation similar or equivalent to that of FIG. 7a, except that the third transistor structure with nanosheets is separated from the first transistor structure by a second trench having a second dielectric wall 109, like in FIG. 2b. In the second trench, as is shown in FIG. 7b, the first contact 112d, can wrap at least partly around a sidewall of the first source/drain portion 120 of the first transistor structure. In various implementations, the contact 112d can wrap at least partly around at least the top and two sidewalls of the first source/drain portion 120 of the first transistor structure.

The third contact 112e can at least partly wrap around the top and a portion of the sidewall which faces the second trench of the first source/drain portion 118 of the third transistor structure. The third contact 112e can be separated from the first contact 112d by the second dielectric wall 109.

Figure 8A:
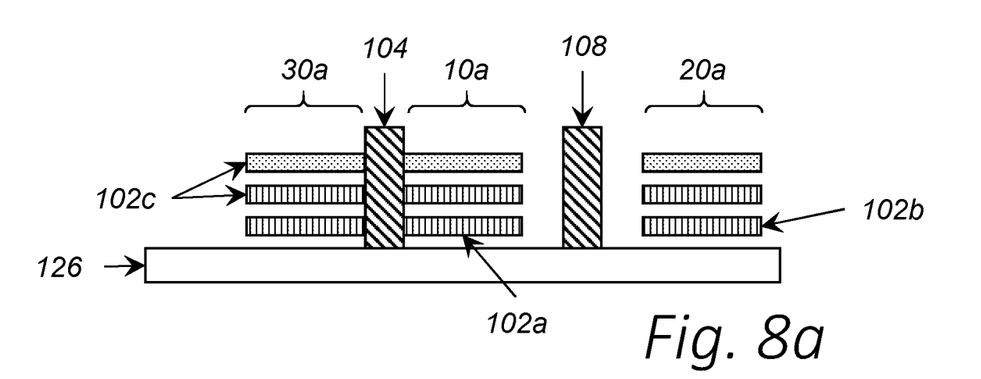
FIGS. 8a and 8b illustrate cross-sections of the channel structures of different transistor structures, in accordance with some embodiments.
Figure 8B:
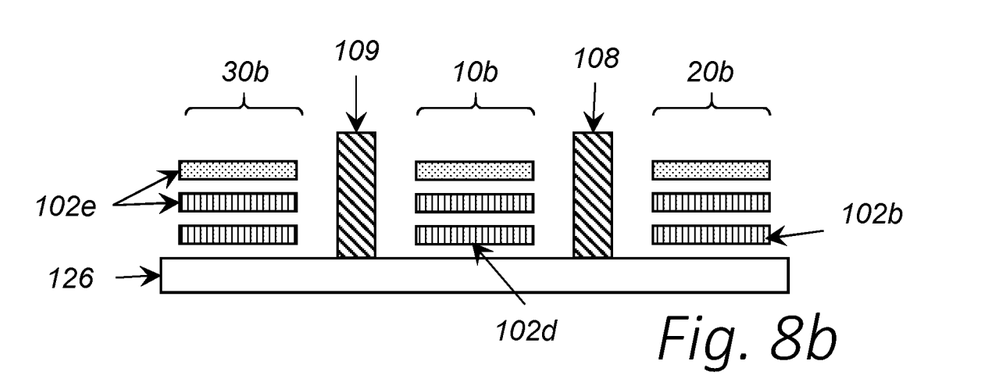

With reference to FIGS. 8a and 8b, differences between a walled forksheet transistor structure and a walled nanosheet transistor structure will be described.

FIG. 8a shows a cross-section through a channel region of a walled forksheet transistor structure. For example, the illustration in FIG. 8a may correspond to a cross-section taken through the channel region 50 of FIG. 1. For illustrative purposes, only the three pluralities of stacked nanosheets 102a-c, the dielectric walls 104, 108 and the substrate 126 are shown.

FIG. 8b shows a cross-section through a channel region of a nanosheet transistor structure, such as the nanosheet transistor structures illustrated in FIGS. 2b and 7b. For illustrative purposes, only the three pluralities of stacked nanosheets 102d, 102b, 102e, the dielectric walls 108, 109 and the substrate 126 are shown.

In both FIGS. 8a and 8b, the plurality of horizontally stacked nanosheets 102a, 102d in the first FET device region 10a-b can be separated from the plurality of horizontally stacked nanosheets 102b in the second FET device region 20a-b by a trench comprising a first dielectric wall 108. The first dielectric wall 108 may improve the electrical isolation between the FET devices formed in the first FET device region 10a and the second FET device region 20a.

In FIG. 8a, the second dielectric wall 104 can be formed between the plurality of horizontally stacked nanosheets 102a in the first FET device region 10a and the plurality of horizontally stacked nanosheets 102c in the third FET device region 30a. The two stacks of nanosheets 102a, 102c and the second dielectric wall 104 can form a forklike structure.

The second dielectric wall 104 may provide increased electrical isolation between the nanosheets 102a of the first transistor structure and the nanosheets 102c of the third transistor structure. In various implementations, the first FET device formed in the first FET device region 10a and the third FET device formed in the third FET device region 30c may be formed more closely together (e.g., with a shorter distance/pitch between them) on the substrate 126.

Gate structures may be formed partially wrapping around the nanosheets 102a, 102c of the first and third transistor structures e.g., since nanosheets 102a, 102c are only attached to a wall on one side.

As in FIG. 8a, in FIG. 8b, the stack of nanosheets 102d in the first FET device region 10b can be separated from the stack of nanosheets 102b formed in the second FET device region 20b by a first trench comprising a first dielectric wall 108. Further, the stack of nanosheets 102e in the third FET device region 30b can be separated from the stack of nanosheets 102d in the first FET device region 10b by a second trench comprising a second dielectric wall 109. In FIG. 8b, as both sides of the stacks of nanosheets 102b, 102d, 102e are free (e.g., not connected to a dielectric wall) a gate may be formed wrapping fully around the nanosheets 102b, 102d, 102e. A gate wrapping fully around channel structure (e.g., being formed around and between the nanosheets) may improve control of the horizontally oriented flow of charge carriers between the source and drain portions within the final FET device.

While methods and processes may be depicted in the drawings and/or described in a particular order, it is to be recognized that the steps need not be performed in the particular order shown or in sequential order, or that all illustrated steps be performed, to achieve desirable results. Further, other steps that are not depicted may be incorporated in the example methods and processes that are schematically illustrated. For example, one or more additional steps may be performed before, after, simultaneously, or between any of the illustrated steps. Additionally, the steps may be rearranged or reordered in other embodiments.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A method of forming a semiconductor device comprising a first field-effect transistor (FET) device and a second FET device, the method comprising:
    forming, on a semiconductor substrate, a first transistor structure and a second transistor structure separated by a first trench, the first trench comprising a first dielectric wall protruding above a top surface of the transistor structures,
    wherein each of the first and the second transistor structures comprises a plurality of stacked nanosheets forming a channel structure, and a source portion and a drain portion horizontally separated by the channel structure;
    depositing a contact material over the transistor structures and the first dielectric wall, thereby filling the first trench and contacting a first source/drain portion of the first transistor structure and a first source/drain portion of the second transistor structure; and
    etching back the contact material below a top surface of the first dielectric wall, thereby forming a first contact contacting the first source/drain portion of the first transistor structure, and a second contact contacting the first source/drain portion of the second transistor structure,
    wherein forming the first transistor structure and the second transistor structure on the semiconductor substrate comprises:
        prior to the formation of the first dielectric wall:
            etching the semiconductor substrate through the first trench,
        thereby forming a substrate trench, and
            forming a buried power rail (BPR) in the substrate trench; and
        prior to depositing the contact material, applying a mask layer including an opening exposing at least a portion of the first source/drain portion of the first transistor structure, a portion of the first trench between the first transistor structure and the first dielectric wall, and a portion of the first dielectric wall, the mask layer covering another portion of the first dielectric wall;
        exposing the BPR by etching through the exposed portion of the first trench; and
        removing the mask layer.

2. The method of claim 1, wherein the first FET device and the second FET device are of a same dopant type.

3. The method of claim 1, wherein depositing a contact material comprises depositing the contact material in a continuous line extending in a direction from the first source/drain portion of the first transistor structure towards the first source/drain portion of the second transistor structure, across the transistor structures, the first trench and the first dielectric wall.

4. The method of claim 1, wherein forming the first dielectric wall comprises:
    forming spacers in the first trench at sidewalls of the first transistor structure and the second transistor structure, the spacers protruding above a top surface of the transistor structures;
    forming the first dielectric wall in the first trench between the spacers; and
    removing the spacers.

5. The method of claim 1, further comprising:
    forming, on the semiconductor substrate, a third transistor structure separated from the first transistor structure by a second trench having a smaller width than the first trench, wherein the third transistor structure comprises a plurality of stacked nanosheets forming a channel structure, and a source portion and a drain portion horizontally separated by the channel structure;
    forming a second dielectric wall filling the second trench, the second dielectric wall protruding above a top surface of the transistor structures; and
    etching back the contact material below a top surface of the second dielectric wall.

6. The method of claim 5, wherein a third FET device, formed from the third transistor structure, is a FET device of a different dopant type than the first FET device.

7. The method of claim 5, wherein depositing the contact material comprises depositing the contact material in a continuous line across the first, second, and third transistor structures, and etching the contact material below the top surface of the first and second dielectric walls divides the contact material into three contacts, the first contact contacting the first source/drain portion of the first transistor structure, the second contact contacting a first source/drain portion of the second transistor structure, and the third contact contacting a first source/drain portion of the third transistor structure.

8. The method of claim 1, further comprising:
   forming, on the semiconductor substrate, a third transistor structure with nanosheets separated from the first transistor structure by a second trench, the second trench comprising a second dielectric wall protruding above a top surface of the transistor structures;
   wherein the third transistor structure comprises a plurality of stacked nano sheets forming a channel structure, and a source portion and a drain portion horizontally separated by the channel structure;
   wherein the method further comprises etching back the contact material below a top surface of the second dielectric wall.

9. The method of claim 8, wherein forming the second dielectric wall comprises:
   forming spacers in the second trench at sidewalls of the first transistor structure and the third transistor structure, the spacers protruding above a top surface of the transistor structures;
   forming the second dielectric wall in the second trench between the spacers; and
   removing the spacers.

10. The method of claim 8, wherein a third FET device, formed from the third transistor structure, is a FET device of a different dopant type than the first FET device.

11. The method of claim 8, wherein depositing the contact material comprises depositing the contact material in a continuous line across the first, second, and third transistor structures, and etching the contact material below the top surface of the first and second dielectric walls divides the contact material into three contacts, the first contact contacting the first source/drain portion of the first transistor structure, the second contact contacting a first source/drain portion of the second transistor structure, and the third contact contacting a first source/drain portion of the third transistor structure.

12. The method of claim 1, further comprising, prior to forming the contact material:
   forming an interlayer dielectric over the transistor structures and the first dielectric wall, and filling the first trench;
   removing the interlayer dielectric in a region extending between the first source/drain portion of the first transistor structure and the first source/drain portion of the second transistor structure across the first dielectric wall and the first trench.

13. The method of claim 12, wherein each of the transistor structures comprise a sacrificial gate structure extending across the channel structures, and wherein the method comprises, prior to removing the interlayer dielectric in the region, replacing the sacrificial gate structure with a final gate structure.

14. The method of claim 1, wherein forming the first transistor structure and the second transistor structure on the semiconductor substrate comprises, prior to the formation of the first dielectric wall:
   etching the semiconductor substrate through the first trench, thereby forming a substrate trench; and
   filling the substrate trench with an isolating material.

15. The method of claim 14, further comprising forming a dielectric cap over the BPR, the dielectric cap formed from a different material than the isolating material.

16. The method of claim 15, further comprising selectively etching a portion of the dielectric cap to expose the BPR.

17. The method of claim 1, wherein the contact material wraps at least partly around the nanosheets of the first transistor structure.

18. The method of claim 17, wherein the contact material forms a wrap-around contact.

* * * * *